(12) United States Patent
Miyagawa

(10) Patent No.: US 8,174,102 B2
(45) Date of Patent: May 8, 2012

(54) SEMICONDUCTOR DEVICE

(75) Inventor: Yuichi Miyagawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 263 days.

(21) Appl. No.: 12/591,148

(22) Filed: Nov. 10, 2009

(65) Prior Publication Data

US 2010/0117210 A1 May 13, 2010

(30) Foreign Application Priority Data

Nov. 13, 2008 (JP) ................... 2008-291467

(51) Int. Cl.
*H01L 23/06* (2006.01)
(52) U.S. Cl. ........................ 257/684; 257/686
(58) Field of Classification Search .................. 257/684, 257/686, 777, 701
See application file for complete search history.

(56) References Cited

U.S. PATENT DOCUMENTS

| | | | | |
|---|---|---|---|---|
| 5,822,190 A * | 10/1998 | Iwasaki | ................ | 361/737 |
| 6,014,318 A * | 1/2000 | Takeda | ................ | 361/764 |
| 7,294,925 B2 * | 11/2007 | Choi et al. | ................ | 257/710 |
| 7,402,900 B2 * | 7/2008 | Ooi et al. | ................ | 257/684 |
| 7,838,878 B2 * | 11/2010 | Greisen | ................ | 257/48 |
| 7,838,976 B2 * | 11/2010 | Yamazaki et al. | ................ | 257/684 |
| 2004/0048421 A1 * | 3/2004 | Noguchi | ................ | 438/128 |
| 2011/0024887 A1 * | 2/2011 | Chi et al. | ................ | 257/684 |

FOREIGN PATENT DOCUMENTS

JP          10-242380          9/1998

* cited by examiner

*Primary Examiner* — S. V Clark

(74) *Attorney, Agent, or Firm* — McGinn IP Law Group, PLLC

(57) ABSTRACT

A semiconductor device including: a substrate formed with a concave portion at one surface thereof; and a first semiconductor chip provided in the concave portion of the substrate and is adhered to the substrate by an underfill in the concave portion, wherein the concave portion includes a chip arrangement region in which the first semiconductor chip is arranged, and an adjustment region which protrudes from at least a portion of the periphery of the chip arrangement region when seen in a plan view at a height of at least a portion of a region where the first semiconductor chip is placed in a stacked direction of the substrate, and has different shapes from the chip arrangement region is provided.

12 Claims, 10 Drawing Sheets

SEMICONDUCTOR DEVICE

This application is based on Japanese patent application No. 2008-291467, the content of which is incorporated hereinto by reference.

BACKGROUND

1. Technical Field

The present invention relates to a semiconductor device.

2. Related Art

A structure has been proposed in which a concave portion is formed in a substrate and a semiconductor chip is provided in the concave portion in order to reduce the thickness of a package when a plurality of semiconductor chips is formed on the substrate.

Japanese Unexamined Patent Publication No. H10-242380 discloses a semiconductor device in which two elements are accommodated in a concave portion formed in a substrate. In this structure, the two elements are arranged with an angle of 90° therebetween. In addition, the two elements are both connected to the substrate by bonding wires.

In addition, there is a structure in which one semiconductor chip is accommodated in a concave portion of a substrate and is connected to the substrate by a flip-chip technique, and an upper semiconductor chip is connected to the substrate by the bonding wires. In this structure, stitches to which the upper semiconductor chip is connected through the bonding wires are provided around the concave portion of the surface of the substrate. In this case, a lower semiconductor chip connected by the flip-chip technique is fixed to the substrate by an underfill. In addition, the upper semiconductor chip is sealed by a sealing resin and the bonding wires are also covered with the sealing resin.

SUMMARY

However, in the structure in which the lower semiconductor chip is connected by the flip-chip technique and the underfill is applied, when the underfill is applied, there is a concern that a surplus of the underfill will be adhered to the surface of the lower semiconductor chip or it will flow to the outside of the concave portion. When the underfill flows out, for example, a manufacturing error occurs due to an assembly error when the upper semiconductor chip is mounted. Therefore, it is necessary to prevent the underfill from flowing out. However, when the amount of underfill is reduced in order to prevent the generation of a surplus of the underfill, it is necessary to change the design and control the manufacturing process, which results in low productivity. Therefore, in the related art, the concave portion is formed with a large margin along the edge of the lower semiconductor package. In this case, the size of the semiconductor device when seen in a plan view increases. In addition, the position of the stitches provided at the surface of the substrate is restricted, or the flexibility of the arrangement of the stitches or the flexibility of an interconnect pattern is lowered.

In one embodiment, there is provided a semiconductor device including: a substrate formed with a concave portion at one surface thereof; and a first semiconductor chip provided in the concave portion of the substrate and is adhered to the substrate by an underfill in the concave portion, wherein the concave portion includes a chip arrangement region in which the first semiconductor chip is arranged, and an adjustment region which protrudes from at least a portion of the periphery of the chip arrangement region when seen in a plan view at a height of at least a portion of a region where the first semiconductor chip is placed in a stacked direction of the substrate, and has different shapes from the chip arrangement region.

According to the above-mentioned structure, the adjustment region for preventing a surplus of the underfill from creeping up is provided in the concave portion for accommodating the lower first semiconductor chip, and the concave portion has a different shape from the chip arrangement region that is substantially the same as the shape of the first semiconductor chip. Therefore, it is possible to control the flow of a surplus of the underfill. In addition, it is possible to provide a region in which the adjustment region is not provided or an adjustment region with a small width in the periphery of the chip arrangement region. In this way, unlike the related art, it is not necessary to form the concave portion with a large margin along the edge of the lower semiconductor package and it is possible to reduce the size of a semiconductor device. In addition, for example, it is possible to arrange the stitches, which are connected to the second semiconductor chip, which is a second or more layer, formed on the first semiconductor chip through the bonding wires, close to portions of the concave portion in which the adjustment region is not provided or the adjustment region with a small width. Therefore, it is possible to reduce the size of a semiconductor device.

The invention also includes any combination of the above-mentioned components and any method and apparatus using the invention.

According to the above-mentioned embodiment of the invention, it is possible to reduce the size of a semiconductor device.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
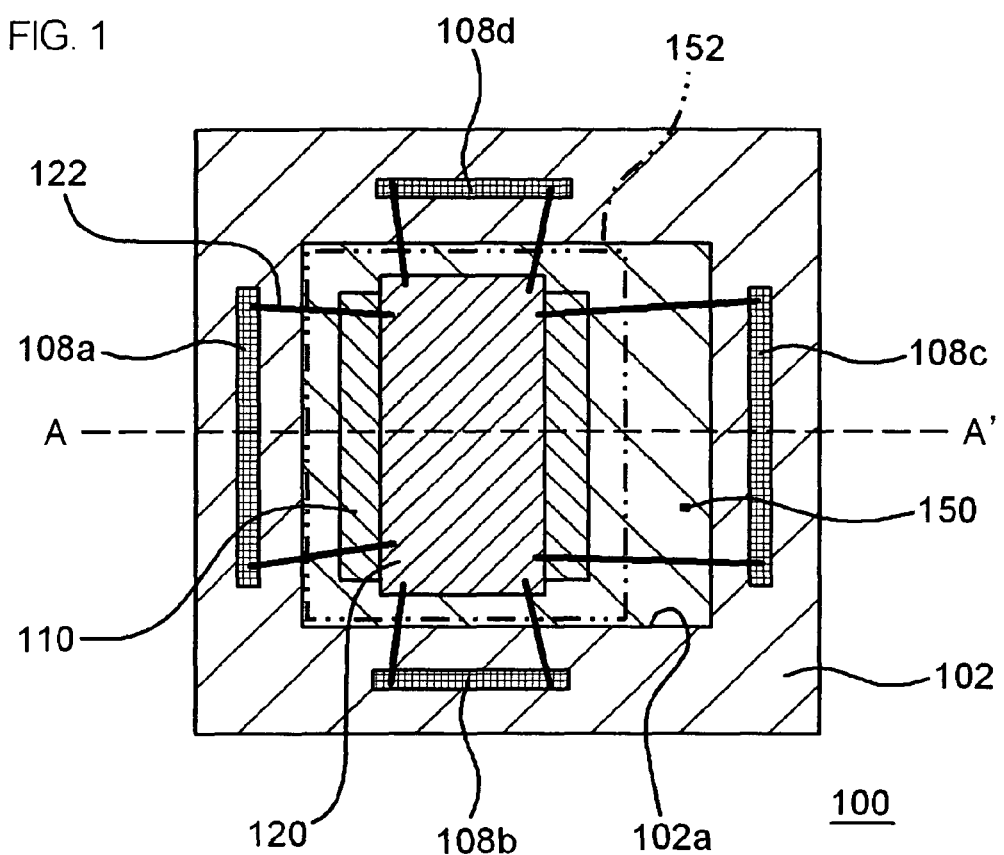
FIG. 1 is a plan view illustrating an example of the structure of a semiconductor device according to an embodiment of the invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, exemplary embodiments of the invention will be described with reference to the accompanying drawings. In the drawings, the same components are denoted by the same reference numerals and a description thereof will not be repeated.

Figure 2:
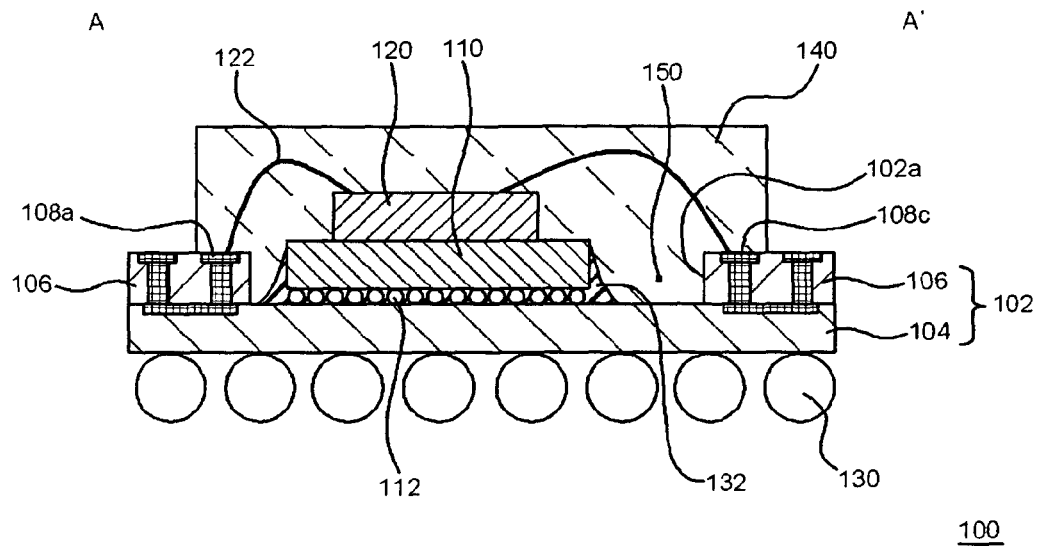
FIG. 2 is a cross-sectional view taken along the line A-A' of FIG. 1.

FIG. 1 is a plan view illustrating an example of the structure of a semiconductor device 100 according to this embodiment. FIG. 2 is a cross-sectional view taken along the line A-A' of FIG. 1.

The semiconductor device 100 includes a substrate 102 and a first semiconductor chip 110 and a second semiconductor chip 110 and 120 formed on the substrate 102 in this order. In this embodiment, the first semiconductor chip 110 and the second semiconductor chip 120 each have a rectangular shape when seen in a plan view. The second semiconductor chip 120 is formed on the first semiconductor chip 110 such that their long axes are aligned with each other.

As shown in FIG. 2, in this embodiment, the substrate 102 includes a substrate 104 and a substrate 106 formed on the substrate 104. The substrate 104 and the substrate 106 of the substrate 102 may be interconnect substrates each having an interconnect layer. In this embodiment, each of the substrate 104 and the substrate 106 may be a multi-layer interconnect substrate including a plurality of interconnect layers connected to each other. Hereinafter, a stacked structure of the substrate 104 and the interconnect layer 106 will be described as the substrate 102.

There is provided a stitch 108a, a stitch 108b, a stitch 108c, and a stitch 108d, which are connected to bonding wires 122, are provided at one surface (hereinafter, referred to as a front surface) of the substrate 102. A concave portion 102a is formed in the one surface of the substrate 102. In this embodiment, the concave portion 102a is provided in the substrate 106.

In this embodiment, the first semiconductor chip 110 is arranged in the concave portion 102a formed in the substrate 102. In addition, the first semiconductor chip 110 is electrically connected to interconnects of the substrate 102 through bumps 112 in the concave portion 102a by a flip-chip technique. In addition, the first semiconductor chip 110 is adhered to the substrate 102 by an underfill 132 in the concave portion 102a.

In this embodiment, the second semiconductor chip 120 is formed on the first semiconductor chip 110 and is adhered to the first semiconductor chip 110 by an adhesive (not shown). A bonding pad (not shown) is provided on a surface (hereinafter, referred to as a front surface) of the second semiconductor chip 120 opposite to the surface that is adhered to the first semiconductor chip 110. In this embodiment, a plurality of bonding pads may be provided at four sides of the front surface of the second semiconductor chip 120 and the bonding wire 122 may be connected to each of the bonding pads. The bonding wires 122 formed at the four sides are connected to the stitches 108a to 108d formed in the front surface of the substrate 102. The stitches 108a to 108d are provided along the corresponding sides of the second semiconductor chip at a distance from the concave portion 102a formed at the front surface of the substrate 102. In FIG. 1, for clarity of explanation, only the bonding wires 122 provided at the ends of each side are shown.

As shown in FIG. 2, a sealing resin 140 is formed on the substrate 102 so as to cover the second semiconductor chip 120 and the first semiconductor chip 110. In FIG. 1, the sealing resin 140 is not shown. In the other plan views, the sealing resin 140 is not shown as well. Solder balls 130 are provided on the other surface of the substrate 102.

In this embodiment, the shape of the concave portion 102a for accommodating the lower first semiconductor chip 110 is examined.

The concave portion 102a includes a chip arrangement region 152 in which the first semiconductor chip 110 is arranged, and an adjustment region 150 that protrudes from at least a portion of the periphery of the chip arrangement region 152 when seen in a plan view at a height of at least a portion of a region where the first semiconductor chip 110 is placed in the stacked direction of the substrate 102. The concave portion 102a has a different shape from the chip arrangement region 152. Here, different shape means that the outlines of the concave portion 102a and the chip arrangement region 152 may have partially parallel region but they are not in parallel along whole regions. The region where the first semiconductor chip 110 is placed may be a region that extends from the bottom of the concave portion on which the first semiconductor chip 110 is placed to a height lower than a surface (hereinafter, referred to as a front surface) opposite to the surface of the first semiconductor chip 110 on which the bumps 112 are provided. In this way, as such the region is formed to include adjustment region 150, it is possible to prevent the underfill 132 from creeping up on the front surface of the first semiconductor chip 110.

The adjustment region 150 is formed with a sufficiently large size to accommodate a surplus of the underfill 132 such that the surplus of the underfill 132 does not creep up on the front surface of the first semiconductor chip 110 or the front surface of the substrate 102 when the first semiconductor chip 110 is adhered to the substrate 102 by the underfill 132.

The chip arrangement region 152 may include a region with a predetermined width that is formed in the periphery of the first semiconductor chip 110 along each side of the first semiconductor chip 110. The predetermined width may be, for example, about 25 μm. The chip arrangement region 152 may have a rectangular shape when seen in a plan view. The rectangular shape includes a shape in which four corners are removed, which will be described with reference to FIG. 5.

The adjustment region 150 may protrude from the edge of the chip arrangement region 152 in the periphery of the chip arrangement region 152 with a non-uniform gap therebetween when seen in a plan view. In the example shown in FIGS. 1 and 2, the adjustment region 150 may protrude to a portion of the periphery of the chip arrangement region 152 when seen in a plan view. In this embodiment, the adjustment region 150 is provided so as to protrude from one side of the first semiconductor chip 110 with more than the predetermined width of the chip arrangement region 152 when seen in a plan view.

The adjustment region 150 may be selectively provided only between the chip arrangement region 152 and the stitch 108c among the stitches 108a to 108d that are connected to the second semiconductor chip 120 formed on the first semiconductor chip 110 through the bonding wires 122. As such, when the adjustment region 150 is provided so as to protrude to only a portion of the periphery of the chip arrangement region 152, it is possible to control the flow of a surplus of the underfill 132 and it is not necessary to provide the adjustment region 150 in the other portion of the periphery of the chip arrangement region. In this way, for example, it is possible to reduce the distances between the first semiconductor chip 110 and the stitches 108a, 108b, and 108d and thus reduce the size of the substrate 102.

In this embodiment, the adjustment region 150 is provided only between the chip arrangement region 152 and the stitch 108c. However, the adjustment region 150 may be provided at two or three positions among four positions between the chip arrangement region 152 and the stitches 108a to 108d. In this case, it is possible to control the flow of a surplus of the underfill 132, as compared to the structure in which a concave portion for accommodating the first semiconductor chip 110 is uniformly provided in the periphery of the chip arrangement region 152. Therefore, it is possible to reduce the overall size of the semiconductor device 100.

The adjustment region 150 may be provided such that a region, in which a jig, such as an injection nozzle for the underfill 132, is sufficiently provided, is ensured when the underfill 132 is applied. In this way, it is possible to apply the underfill to a desired position and thus prevent the underfill from being insufficiently applied or voids from being formed.

In this embodiment, the concave portion 102a has the same planar shape in a height range from the bottom on which the first semiconductor chip 110 is provided to the front surface of the substrate 102. That is, the adjustment region 150 is formed at the overall height of the concave portion 102a. The depth (in this embodiment, the thickness of the substrate 106) of the concave portion 102a may be, not limited though, equal to or less than 350 μm for example.

Next, the effects of the semiconductor device 100 shown in FIGS. 1 and 2 will be described.

According to the above-mentioned structure, the adjustment region 150 is provided in the concave portion 102a that accommodates the lower first semiconductor chip 110 in order to prevent a surplus of the underfill 132 from creeping up on the surface of the first semiconductor chip 110, and the shape of the concave portion 102a is different from that of the chip arrangement region 152 that is substantially the same as that of the first semiconductor chip 110. Therefore, it is possible to control the flow of a surplus of the underfill 132 and provide a region in which the adjustment region 150 is not provided in the periphery of the chip arrangement region 152. In this way, it is possible to arrange the stitches 108a, 108b, and 108d, which are connected to the upper second semiconductor chip 120 formed on the first semiconductor chip 110 through the bonding wires 122, close to portions of the concave portion 102a in which the adjustment region 150 is not provided. Therefore, it is possible to increase the mounting density of the semiconductor device 100 and the flexibility of interconnection and reduce the thickness of the semiconductor device 100 and the size of a package.

The adjustment region 150 makes it possible to prevent the underfill 132 from creeping up on the surface of the semiconductor chip when the underfill 132 is applied. Therefore, it is possible to widen the range of the application conditions of the underfill 132 and stably improve productivity. In addition, it is possible to provide a jig, such as an injection nozzle for the underfill 132, in the concave portion 102a and thus effectively apply the underfill 132.

Figure 3:
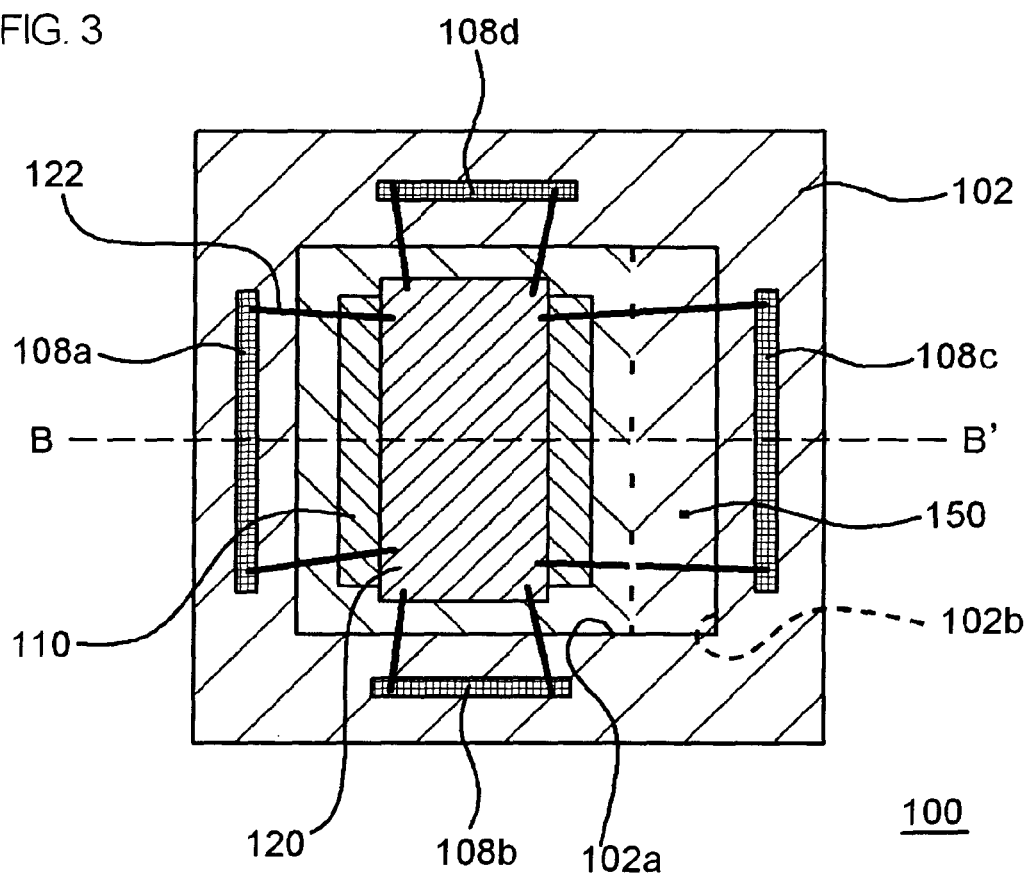
FIG. 3 is a plan view illustrating another example of the structure of the semiconductor device according to the embodiment of the invention.
Figure 4:
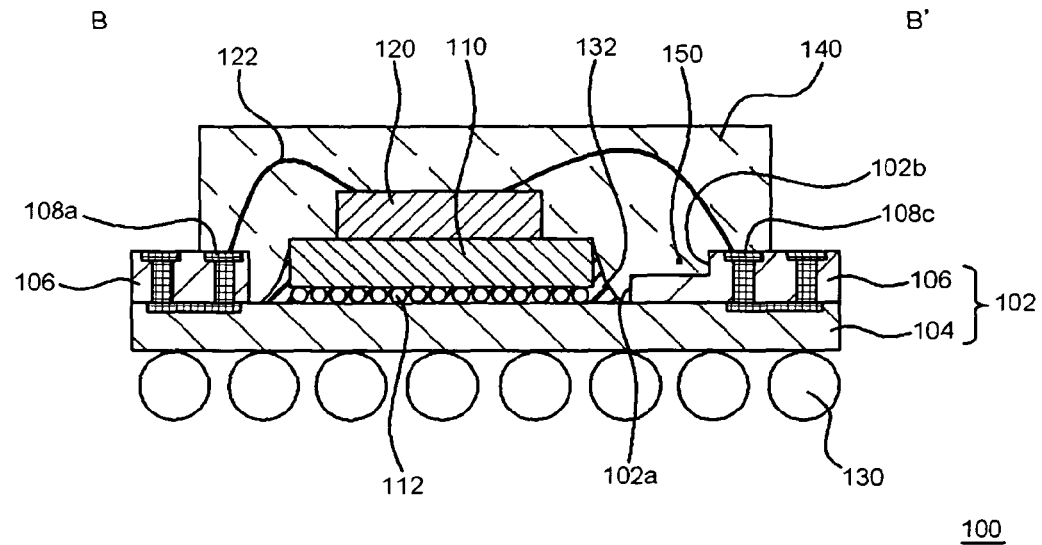
FIG. 4 is a cross-sectional view taken along the line B-B' of FIG. 3.

FIG. 3 is a plan view illustrating another example of the structure of the semiconductor device 100 according to this embodiment. FIG. 4 is a cross-sectional view taken along the line B-B' of FIG. 3.

In this example, the adjustment region 150 of the concave portion 102a is provided at the height of a portion of a region where the first semiconductor chip 110 is placed in the stacked direction of the substrate 102. The concave portion 102a has the shape of the chip arrangement region 152 when seen in a plan view in a height range from the bottom over which the first semiconductor chip 110 is placed to a middle portion of the height of the front surface of the substrate 102, and has a shape including the chip arrangement region 152 and the adjustment region 150 when seen in a plan view in a height range from the middle portion of the height to the front surface to the surface 102. The concave portion 102a may include a step 102b.

According to the above-mentioned structure, it is possible to obtain the same effects as those of the semiconductor device 100 shown in FIGS. 1 and 2. In addition, the concave portion 102a may include a plurality of steps in the adjustment region 150.

Figure 5:
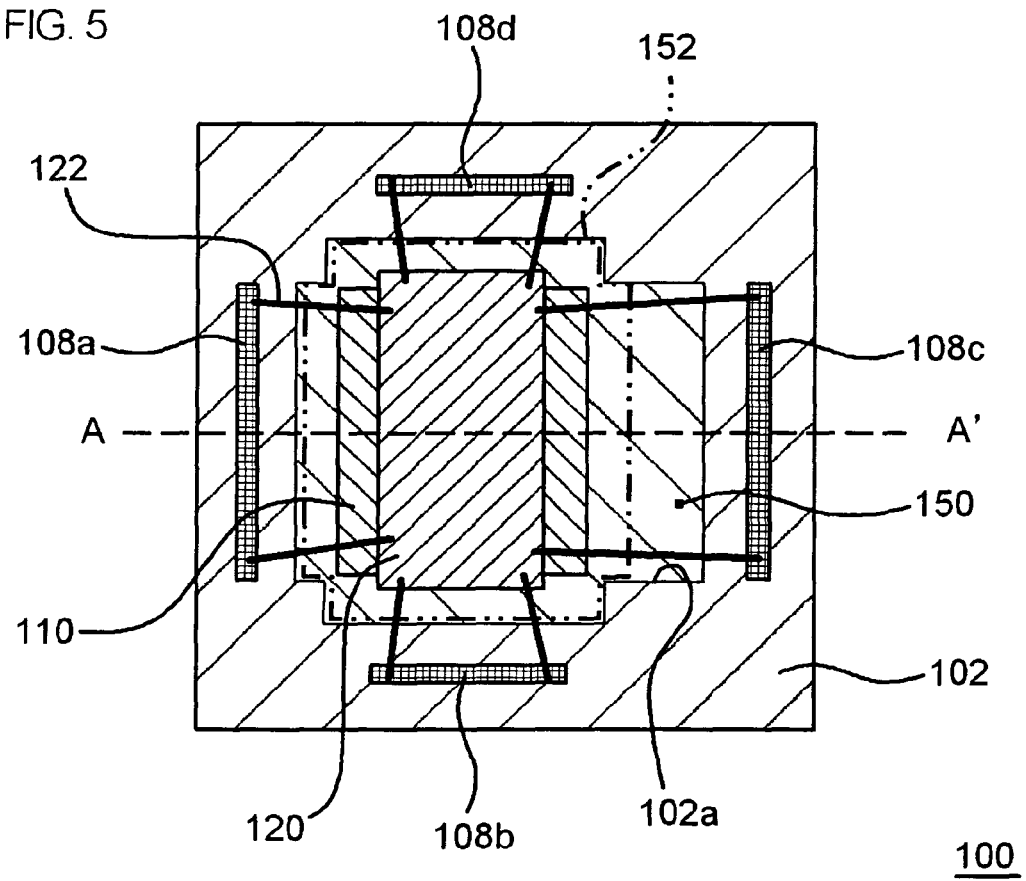
FIG. 5 is a plan view illustrating still another example of the structure of the semiconductor device according to the embodiment of the invention.

FIG. 5 is a plan view illustrating still another example of the structure of the semiconductor device 100 according to this embodiment. The cross-sectional view taken along the line A-A' of FIG. 5 is the same as that shown in FIG. 2.

In this example, the shape of the corner of the chip arrangement region 152 in the concave portion 102a is different from that shown in FIG. 1 or FIG. 3. The chip arrangement region 152 may have any of the following shapes: a shape in which the corners of the chip arrangement region are removed; a shape in which the corners of the chip arrangement region are rounded; and the corners of chip arrangement region are chamfered. FIG. 5 shows the chip arrangement region 152 having a cross shape in which the corners thereof are removed when seen in a plan view.

According to the above-mentioned structure, it is possible to obtain the same effects as those of the semiconductor device 100 shown in FIGS. 1 and 2. As for this example as well, the concave portion 102a may include a step in the adjustment region 150 similarly as shown in FIGS. 3 and 4.

Figure 6:
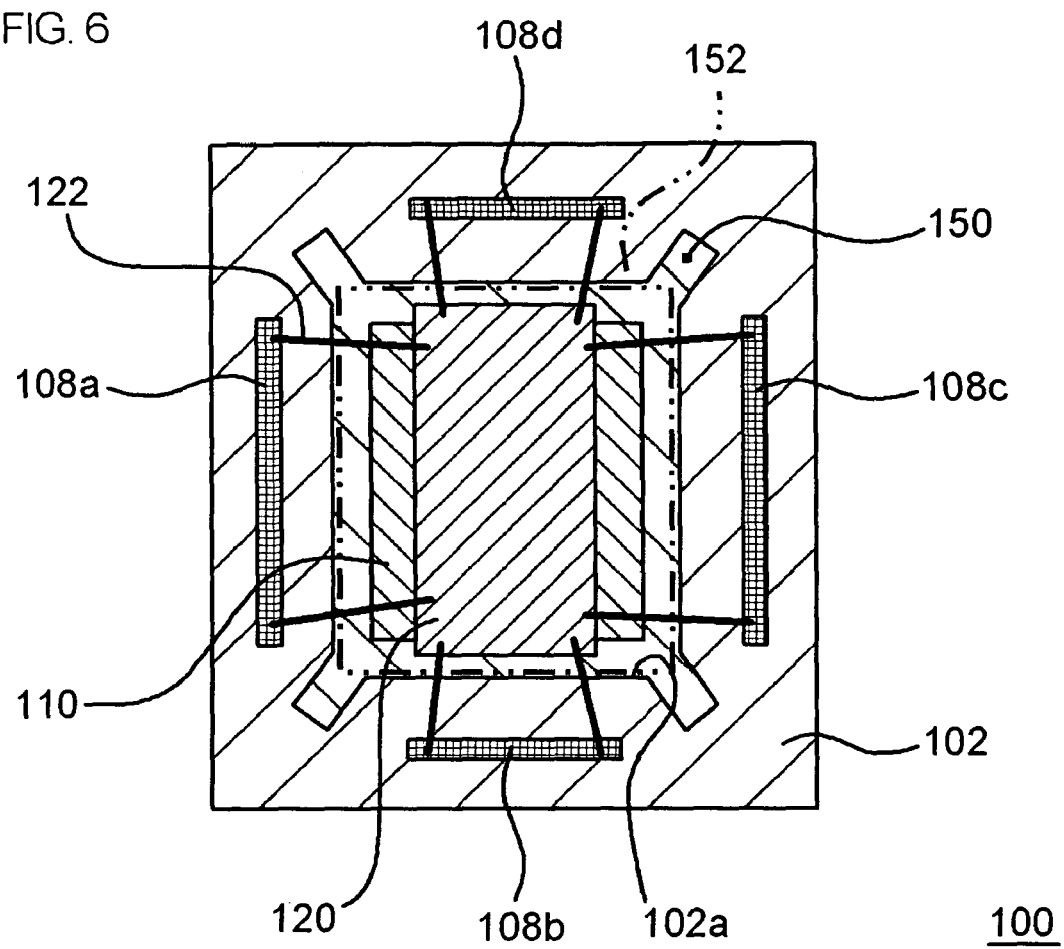
FIG. 6 is a plan view illustrating yet another example of the structure of the semiconductor device according to the embodiment of the invention.

FIG. 6 is a plan view illustrating still yet another example of the structure of the semiconductor device 100 according to this embodiment.

The chip arrangement region 152 has a rectangular shape when seen in a plan view. The second semiconductor chip 120 is formed on the first semiconductor chip 110 such that one side of the second semiconductor chip 120 extends in parallel to one side of the chip arrangement region 152.

In this example, the adjustment region 150 is provided at a position other than the regions between the second semiconductor chip 120 and the stitches 108a to 108d when seen in a plan view. The adjustment region 150 is provided at each corner of the chip arrangement region 152 so as to protrude from the corner of the chip arrangement region 152 in an oblique direction with respect to each side of the chip arrangement region 152. As shown in FIG. 6, the adjustment regions 150 may be formed at four corners of the chip arrangement region 152 or they may be formed at some of the four corners.

According to the above-mentioned structure, it is possible to obtain the same effects as those of the semiconductor device 100 shown in FIGS. 1 and 2. In addition, according to the above-mentioned structure, since the adjustment region 150 is provided at a position different from that where the bonding wire 122 is formed, it is possible to arrange the stitches 108a to 108d close to the second semiconductor chip 120 in all the side surfaces of the second semiconductor chip 120. In this way, it is possible to further reduce the size of the semiconductor device 100.

Figure 7:
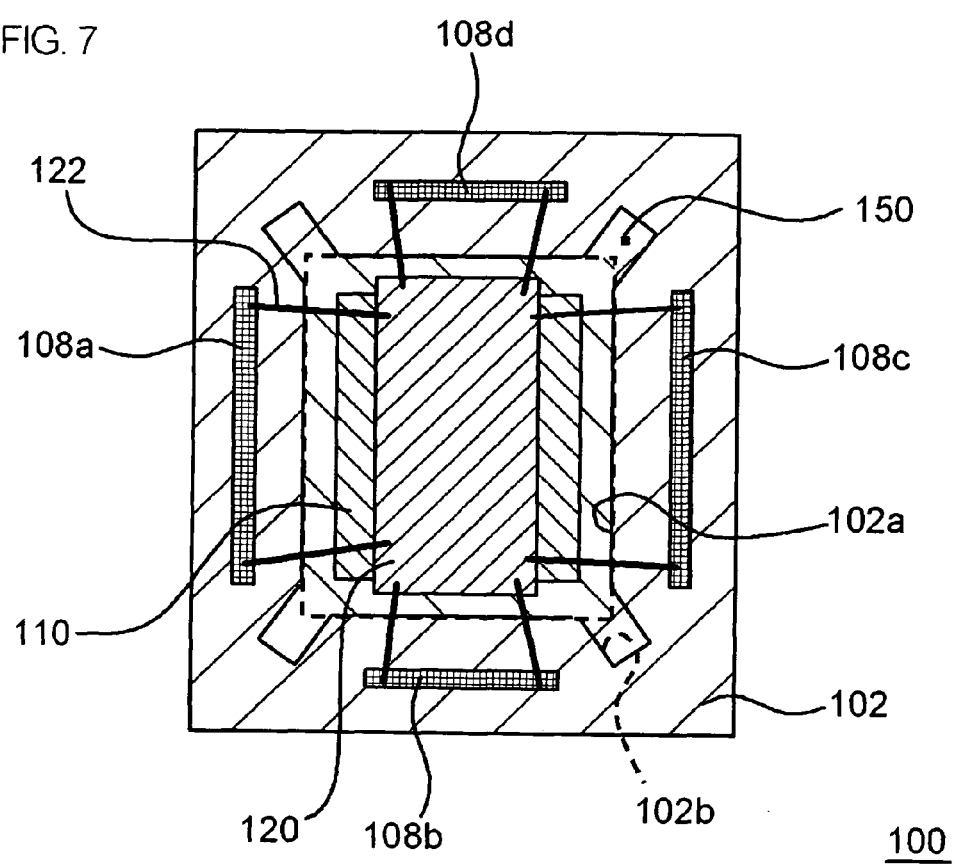
FIG. 7 is a plan view illustrating a modification of the semiconductor device shown in FIG. 6.

FIG. 7 is a plan view illustrating a modification of the semiconductor device 100 shown in FIG. 6.

In the modification, similar to the structures described with reference to FIGS. 3 and 4, the adjustment region 150 is provided at the height of a portion of the region where the first semiconductor chip 110 is placed in the stacked direction of the substrate 102. According to the above-mentioned structure, it is possible to obtain the same effects as those of the semiconductor device 100 shown in FIG. 6. In FIG. 7, the chip arrangement region 152 is not shown. However, the chip arrangement region 152 may have the same structure as that shown in FIG. 6.

Figure 8:
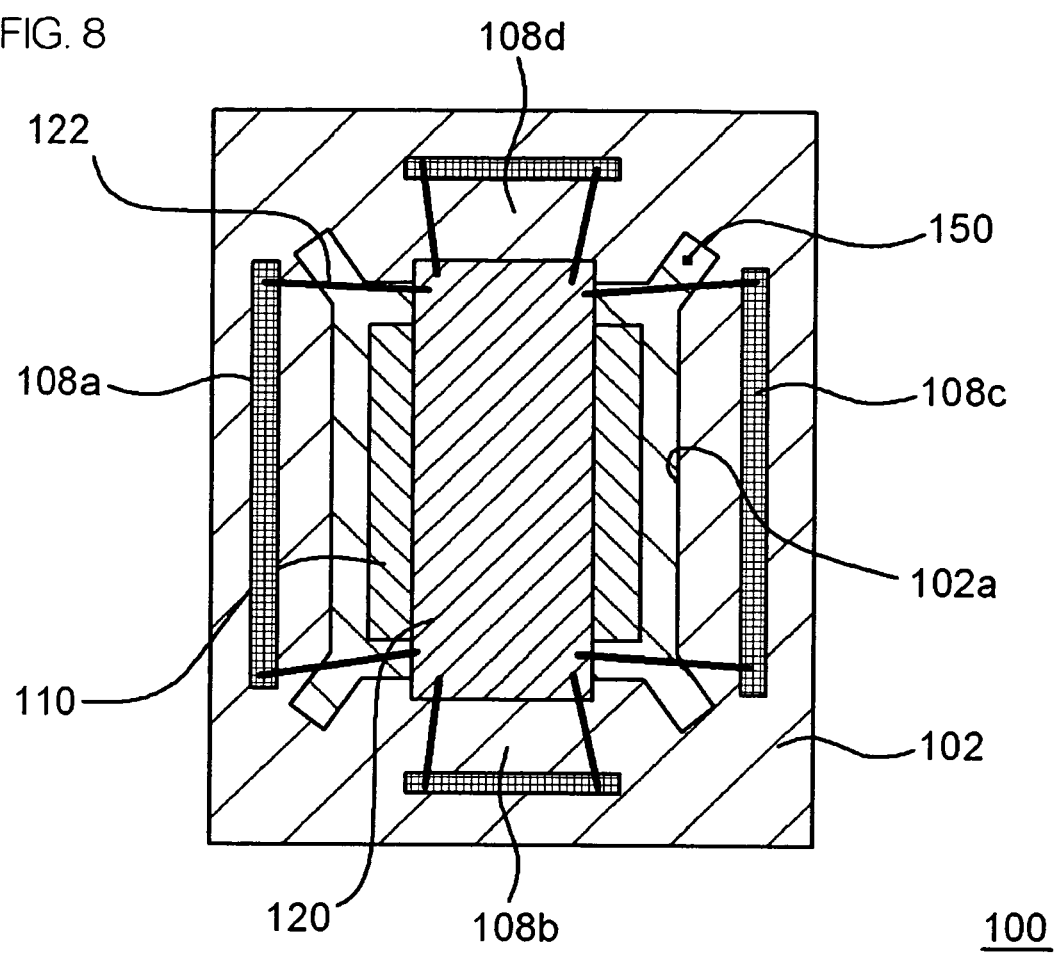
FIG. 8 is a plan view illustrating another modification of the semiconductor device shown in FIG. 6.

FIG. 8 is a plan view illustrating another modification of the semiconductor device 100 shown in FIG. 6.

In this modification, the size of the second semiconductor chip 120 is large, and the second semiconductor chip 120 is provided so as to be laid across the concave portion 102a of the substrate 102. According to the above-mentioned structure, it is possible to obtain the same effects as those of the semiconductor device 100 shown in FIG. 6. As for this example as well, the adjustment region 150 may include a step in the adjustment region 150 similarly as shown in FIG. 7. In FIG. 8, the chip arrangement region 152 is not shown. However, the chip arrangement region 152 may have the same structure as that shown in FIG. 6.

Figure 9:
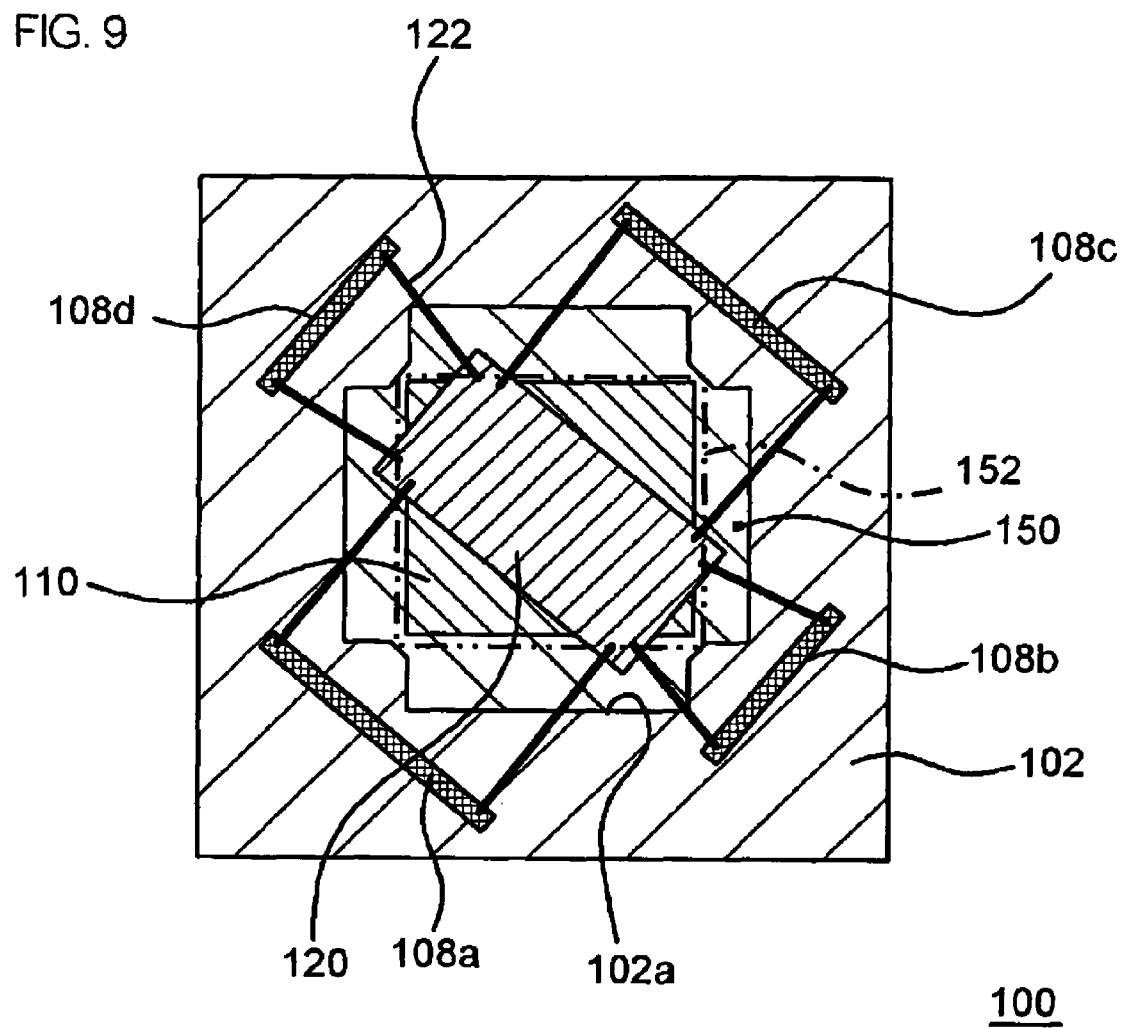
FIG. 9 is a plan view illustrating still yet another example of the structure of the semiconductor device according to the embodiment of the invention.

FIG. 9 is a plan view illustrating still yet another example of the structure of the semiconductor device 100 according to this embodiment.

In this example, the second semiconductor chip 120 may be obliquely provided on the first semiconductor chip 110 such that one side of the second semiconductor chip 120 extends obliquely with respect to one side of the first semiconductor chip 110.

In the example shown in FIG. 9, the second semiconductor chip 120 is arranged at an angle of 45° with respect to the first semiconductor chip 110. In addition, the second semiconductor chip 120 is arranged at an angle of 45° with respect to the substrate 102. According to this arrangement, it is possible to arrange the stitches at positions different from those in the related art and thus improve the range of selection of the arrangement of the stitches. Therefore, it is possible to improve the flexibility of the interconnect pattern of the substrate 102. In this embodiment, the stitches 108a to 108d are provided in the front surface of the substrate 102 along each side of the second semiconductor chip 120 so as to be substantially parallel to each side of the second semiconductor chip 120. That is, in this example, the stitches 108a to 108d are arranged obliquely with respect to each side of the first semiconductor chip 110 and each side of the substrate 102.

In the substrate 102, lead lines for performing electrolytic plating on the stitches formed in the front surface of the substrate 102 extend to the edge of the substrate 102. In the arrangement according to this example, when the size of the substrate 102 is assumed to be equal to that of the substrate 102 having the structure in which the second semiconductor chip 120 is not obliquely arranged (arranged in parallel), the distance from each stitch to the edge of the substrate 102 is about √2 (square root of 2) times the distance in the structure in which the second semiconductor chip 120 is not obliquely arranged. In this way, it is possible to improve the flexibility of the interconnect pattern of the substrate 102.

The adjustment regions 150 of the concave portion 102a are provided so as to protrude from each side of the chip arrangement region 152 and have a cross shape having the chip arrangement region as their center when seen in a plan view. In this example, the corners of the chip arrangement region 152 are chamfered.

According to the above-mentioned structure, it is possible to obtain the same effects as those of the semiconductor device 100 shown in FIGS. 1 and 2. That is, it is possible to provide the adjustment regions 150 with a small width in the periphery of the chip arrangement region 152. In this way, it is possible to arrange the stitches, which are connected to the second semiconductor chip 120, which is a second or more layer, formed on the first semiconductor chip 110 through the bonding wires 122, close to the adjustment regions 150 with a small width in the concave portion 102a. In this example, the adjustment regions 150 are provided so as to protrude from four sides of the chip arrangement region 152. Alternatively, the adjustment regions 150 may be provided so as to protrude from some of the four sides of the chip arrangement region 152.

Figure 10:
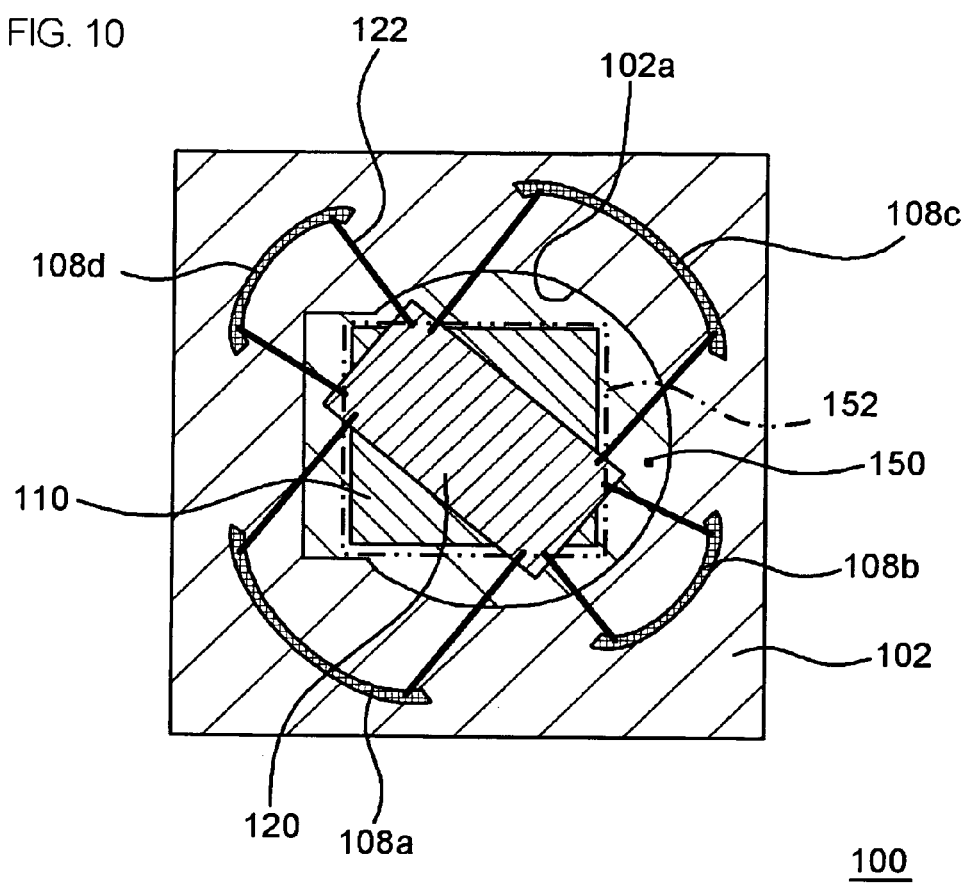
FIG. 10 is a plan view illustrating yet still another example of the structure of the semiconductor device according to the embodiment of the invention.

FIG. 10 is a plan view illustrating yet still another example of the structure of the semiconductor device 100 according to this embodiment.

In this example, the second semiconductor chip 120 may be provided obliquely with respect to the first semiconductor chip 110. Each of the stitches 108a to 108d is formed in a curved line, not a straight line. The adjustment region 150 of the concave portion 102a protrudes in an arc shape from three sides of the chip arrangement region 152 and also protrudes in a rectangular shape from the remaining one side of the chip arrangement region 152. According to the above-mentioned structure, it is possible to arrange the stitches along the periphery of the concave portion 102a. In addition, according to the above-mentioned structure, it is possible to obtain the same effects as those of the semiconductor device 100 shown in FIG. 9.

Although the exemplary embodiment of the invention has been described above with reference to the drawings, the invention is not limited thereto, but various modifications and changes of the invention can be made without departing from the scope and spirit of the invention.

For example, the first semiconductor chip 110 and the second semiconductor chip 120 may have any size relations when seen in a plan view. For instance, the first semiconductor chip 110 may be larger than the second semiconductor chip 120, the first semiconductor chip 110 may be smaller than the second semiconductor chip 120, or the first semiconductor chip 110 and the second semiconductor chip 120 may have same size. In addition, another semiconductor chip may be provided between the first semiconductor chip 110 and the second semiconductor chip 120 or on the second semiconductor chip 120.

Figure 11:
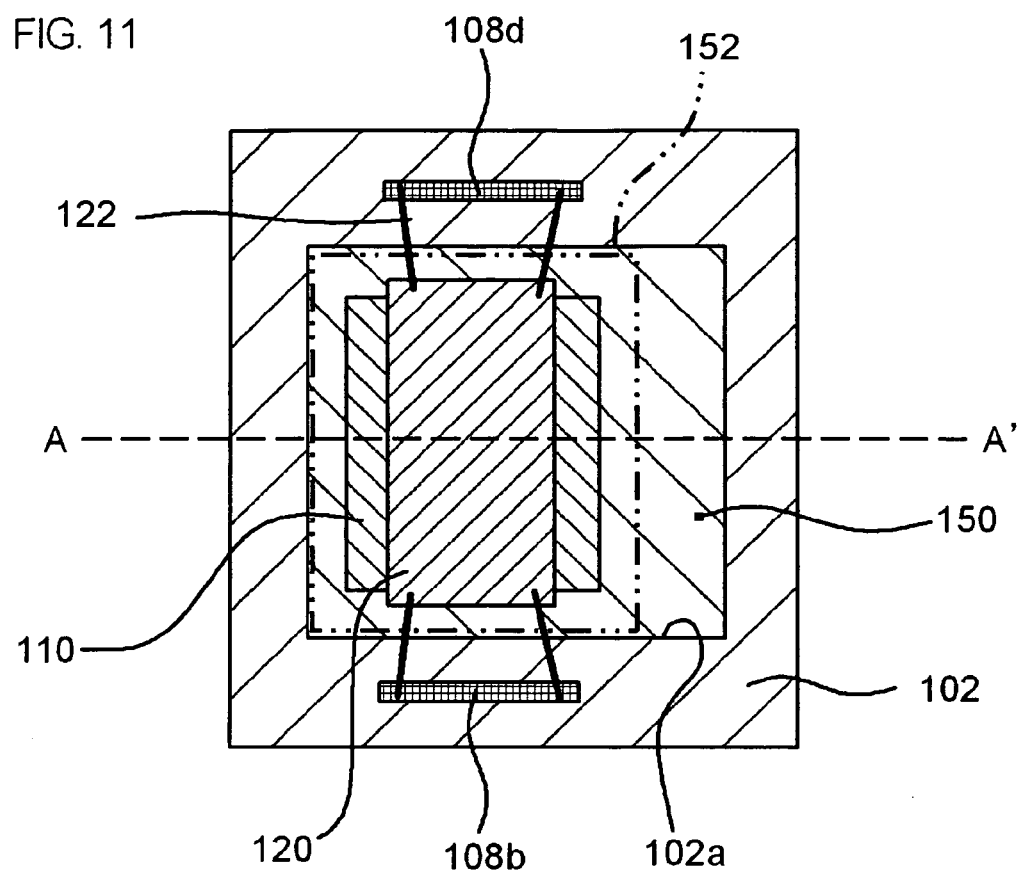
FIG. 11 is a plan view illustrating a modification of the semiconductor device shown in FIG. 1.

As shown in FIG. 11, a plurality of bonding pads (not shown) may be substantially uniformly provided only at some (two sides in FIG. 11) of the four sides of the front surface of the second semiconductor chip 120, and the bonding pads and the stitches may be connected to each other by the bonding wires 122. The stitches (stitches 108b and 108d) are provided only at positions corresponding to the sides of the second semiconductor chip 120 where the bonding pads are provided. In this structure, the adjustment region 150 is provided at a position other than the regions between the second semiconductor chip 120 and the stitches 108b and 108d when seen in a plan view. In this case, the adjustment region 150 may be provided near the side of the second semiconductor chip 120 where the bonding pads are not provided. According to this structure, it is possible to obtain the same effects as those of the semiconductor device 100 shown in FIG. 6.

Figure 12:
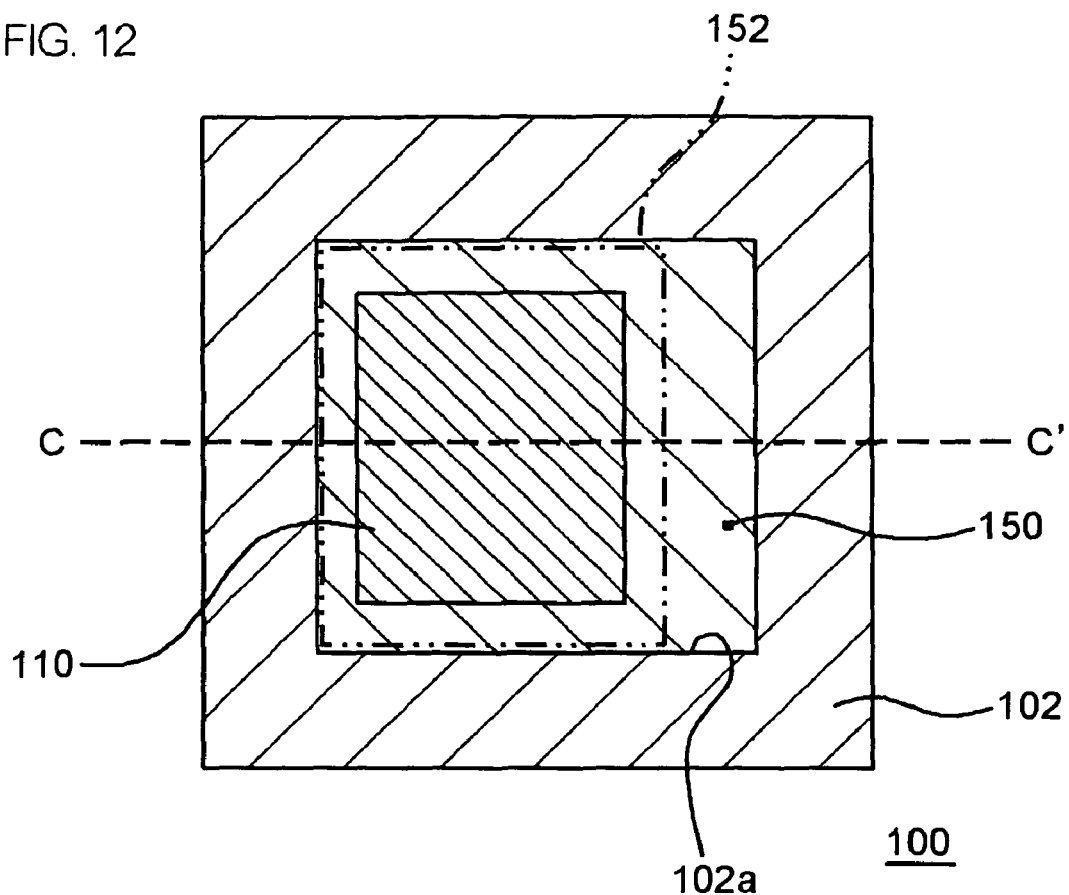
FIG. 12 is a plan view illustrating another modification of the semiconductor device shown in FIG. 1.
Figure 13:
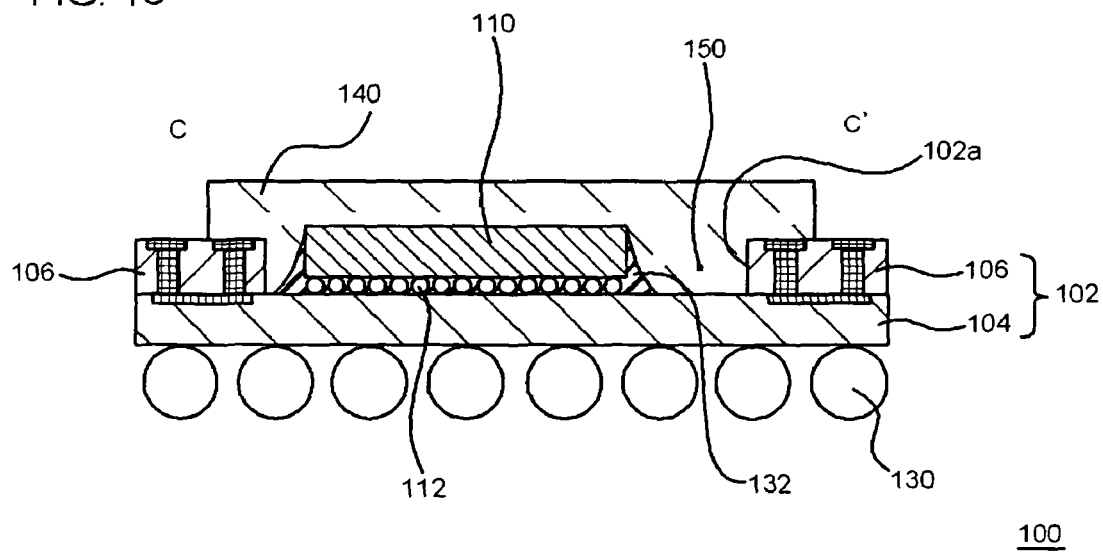
FIG. 13 is a cross-sectional view taken along the line C-C' of FIG. 12.

In the above-described embodiment, the second semiconductor chip 120 is formed on the first semiconductor chip 110. However, as shown in FIGS. 12 and 13, the semiconductor device 100 may include only the first semiconductor chip 110. FIG. 13 is a cross-sectional view taken along the line C-C' of FIG. 12. According to this structure, it is not necessary to form the concave portion with a large margin along the edge of a lower semiconductor package, unlike the related art. Therefore, it is possible to reduce the size of a semiconductor device.

It is apparent that the present invention is not limited to the above embodiment, and may be modified and changed without departing from the scope and spirit of the invention.

What is claimed is:

1. A semiconductor device comprising:
a substrate formed with a concave portion at one surface thereof; and
a first semiconductor chip provided in said concave portion of said substrate and is adhered to said substrate by an underfill in said concave portion,
wherein said concave portion includes a chip arrangement region in which said first semiconductor chip is arranged, and an adjustment region which protrudes from at least a portion of the periphery of said chip arrangement region when seen in a plan view at a height of at least a portion of a region where said first semiconductor chip is placed in a stacked direction of said substrate, and has different shapes from said chip arrangement region.

2. The semiconductor device as set forth in claim 1, wherein said adjustment region of said concave portion is provided in the periphery of said chip arrangement region so as to non-uniformly protrude from the edge of said chip arrangement region.

3. The semiconductor device as set forth in claim 1, wherein said adjustment region of said concave portion protrudes from a portion of the periphery of said chip arrangement region.

4. The semiconductor device as set forth in claim 1,
wherein said first semiconductor chip has a rectangular shape when seen in a plan view,
said chip arrangement region includes regions which are arranged in the periphery of said first semiconductor chip along each side of said first semiconductor chip with a predetermined width, and
said adjustment region protrudes from some of the sides of said first semiconductor chip with said predetermined width or more.

5. The semiconductor device as set forth in claim 1,
wherein said chip arrangement region of said concave portion has a rectangular shape when seen in a plan view, and
said adjustment region protrudes from the corners of said chip arrangement region in an oblique direction with respect to each side of said chip arrangement region.

6. The semiconductor device as set forth in claim 5, further comprising:
a second semiconductor chip formed over said first semiconductor chip and has a rectangular shape when seen in a plan view; and
a stitch provided at said one surface of said substrate,
wherein said second semiconductor chip is electrically connected to said stitch of said substrate through a bonding wire, and
said second semiconductor chip is formed over said first semiconductor chip such that one side of said second semiconductor chip extends in parallel to one side of said chip arrangement region.

7. The semiconductor device as set forth in claim 1, further comprising:
a second semiconductor chip formed over said first semiconductor chip and has a rectangular shape when seen in a plan view; and
a stitch provided at said one surface of said substrate,
wherein said second semiconductor chip is electrically connected to said stitch of said substrate through a bonding wire,
said stitch is provided along one side of said second semiconductor chip at a distance from said concave portion provided at said one surface of said substrate, and
said adjustment region is provided at a position other than a region between said one side of said second semiconductor chip and said stitch.

8. The semiconductor device as set forth in claim 1, further comprising:
a second semiconductor chip formed over said first semiconductor chip; and
a stitch provided at said one surface of said substrate,
wherein said second semiconductor chip is electrically connected to said stitch of said substrate through a bonding wire,
said first semiconductor chip and said second semiconductor chip each have a rectangular shape, respectively, and
said second semiconductor chip is obliquely formed over said first semiconductor chip such that one side of said second semiconductor chip extends obliquely with respect to one side of said first semiconductor chip.

9. The semiconductor device as set forth in claim 1, further comprising:
a second semiconductor chip formed over said first semiconductor chip; and
a stitch provided at said one surface of said substrate,
wherein said second semiconductor chip is electrically connected to said stitch of said substrate through a bonding wire.

10. The semiconductor device as set forth in claim 9,
wherein said second semiconductor chip has a rectangular shape when seen in a plan view, and
said stitch is provided along one side of said second semiconductor chip at a distance from said concave portion formed at said one surface of said substrate.

11. The semiconductor device as set forth in claim 1, wherein said concave portion has the same planar shape in a height range from the bottom over which said first semiconductor chip is provided to said one surface of said substrate.

12. The semiconductor device as set forth in claim 1,
wherein said concave portion has the shape same as said chip arrangement region when seen in a plan view in a height range from the bottom over which said first semiconductor chip is provided to a middle portion and has a shape including said chip arrangement region and said adjustment region when seen in a plan view in a height range from said middle portion to said one surface, said middle portion positions between said bottom and said one surface.

* * * * *